(12) United States Patent
Gehring et al.

(10) Patent No.: US 8,129,236 B2
(45) Date of Patent: Mar. 6, 2012

(54) METHOD FOR CREATING TENSILE STRAIN BY APPLYING STRESS MEMORIZATION TECHNIQUES AT CLOSE PROXIMITY TO THE GATE ELECTRODE

(75) Inventors: Andreas Gehring, Dresden (DE); Anthony Mowry, Buda, TX (US); Andy Wei, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 590 days.

(21) Appl. No.: 12/257,718

(22) Filed: Oct. 24, 2008

(65) Prior Publication Data
US 2009/0246926 A1  Oct. 1, 2009

(30) Foreign Application Priority Data
Mar. 31, 2008  (DE) .......................... 10 2008 016 426

(51) Int. Cl.
*H01L 21/8249* (2006.01)
(52) U.S. Cl. ........................ 438/231; 438/229
(58) Field of Classification Search .................. 438/231
See application file for complete search history.

(56) References Cited

U.S. PATENT DOCUMENTS

| | | | | |
|---|---|---|---|---|
| 6,277,683 B1 * | 8/2001 | Pradeep et al. | ............... | 438/200 |
| 7,348,233 B1 * | 3/2008 | Gerhardt et al. | ............... | 438/199 |
| 7,759,207 B2 * | 7/2010 | Quek et al. | .................. | 438/303 |
| 7,790,537 B2 * | 9/2010 | Wei et al. | ..................... | 438/197 |
| 7,906,385 B2 | 3/2011 | Lenski et al. | .................. | 438/199 |
| 2005/0260810 A1 * | 11/2005 | Cheng et al. | .................. | 438/199 |
| 2006/0286758 A1 * | 12/2006 | Liang et al. | .................. | 438/305 |
| 2007/0122966 A1 * | 5/2007 | Hoentschel et al. | .......... | 438/231 |
| 2007/0141775 A1 * | 6/2007 | Teo et al. | ....................... | 438/231 |
| 2007/0202653 A1 * | 8/2007 | Hoentschel et al. | .......... | 438/301 |
| 2007/0254461 A1 * | 11/2007 | Wei et al. | ...................... | 438/514 |
| 2008/0191243 A1 * | 8/2008 | Liu et al. | ....................... | 257/190 |
| 2009/0001371 A1 * | 1/2009 | Mowry et al. | .................... | 257/51 |
| 2010/0297818 A1 * | 11/2010 | Han et al. | ...................... | 438/230 |

FOREIGN PATENT DOCUMENTS

DE  102006035646 B3  3/2008
DE  102008007003 A1  8/2009

OTHER PUBLICATIONS

Translation of Official Communication from German Patent Office for German Patent Application No. 10 2008 016 426.7 dated Dec. 2, 2008.
Translation of Official Communication from German Patent Office for German Patent Application No. 10 2008 016 426.7 dated Sep. 12, 2011.

* cited by examiner

*Primary Examiner* — Wael Fahmy
*Assistant Examiner* — Grant Withers
(74) *Attorney, Agent, or Firm* — Williams, Morgan & Amerson, P.C.

(57) ABSTRACT

After forming the outer drain and source regions of an N-channel transistor, the spacer structure may be removed on the basis of an appropriately designed etch stop layer so that a rigid material layer may be positioned more closely to the gate electrode, thereby enhancing the overall strain-inducing mechanism during a subsequent anneal process in the presence of the material layer and providing an enhanced stress memorization technique (SMT). In some illustrative embodiments, a selective SMT approach may be provided.

14 Claims, 6 Drawing Sheets

METHOD FOR CREATING TENSILE STRAIN BY APPLYING STRESS MEMORIZATION TECHNIQUES AT CLOSE PROXIMITY TO THE GATE ELECTRODE

BACKGROUND

1. Field of the Disclosure

Generally, the present disclosure relates to the fabrication of integrated circuits, and, more particularly, to the formation of transistors having strained channel regions by using stress-inducing sources to enhance charge carrier mobility in the channel region of a MOS transistor.

2. Description of the Related Art

Generally, a plurality of process technologies are currently practiced to fabricate integrated circuits, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode located close to the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, the conductivity of the channel region is a dominant factor that determines the performance of MOS transistors. Thus, the reduction of the channel length, and associated therewith the reduction of the channel resistivity, is an important design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. For instance, the thickness of the gate insulation layer, typically an oxide-based dielectric, has to be reduced with reducing the gate length, wherein a reduced thickness may result in increased leakage currents, thereby posing limitations for oxide-based gate insulation layers at approximately 1-2 nm. Thus, the continuous size reduction of the critical dimensions, i.e., the gate length of the transistors, necessitates the adaptation and possibly the new development of highly complex process techniques, for example, for compensating for short channel effects with oxide-based gate dielectric scaling being pushed to the limits with respect to tolerable leakage currents. It has, therefore, been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating uniaxial tensile strain in the channel region along the channel length direction for a standard crystallographic orientation increases the mobility of electrons, which in turn may directly translate into a corresponding increase in the conductivity. On the other hand, uniaxial compressive strain in the channel region for the same configuration may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast, powerful semiconductor devices without requiring expensive semiconductor materials, while many of the well-established manufacturing techniques may still be used.

In some approaches, external stress created by, for instance, permanent overlaying layers, spacer elements and the like is used in an attempt to create a desired strain within the channel region. Although a promising approach, the process of creating the strain in the channel region by applying a specified external stress may depend on the efficiency of the stress transfer mechanism for the external stress provided, for instance, by contact layers, spacers and the like into the channel region to create the desired strain therein. Thus, for different transistor types, differently stressed overlayers have to be provided, which may result in a plurality of additional process steps, wherein, in particular, any additional lithography steps may contribute significantly to the overall production costs. Moreover, the amount of stress-inducing material and, in particular, the intrinsic stress thereof may not be arbitrarily increased without requiring significant design alterations. For example, a high degree of tensile stress in corresponding portions of the dielectric layer formed above an N-channel transistor may require development of new deposition recipes, while significantly higher compressive stress may be provided by presently established techniques, thereby creating an imbalance with respect to performance of NMOS and PMOS transistors.

In still a further approach, the substantially amorphized region adjacent to the gate electrode during the formation of the deep drain and source regions may be re-crystallized in the presence of a rigid layer formed above the transistor area. During the anneal process for re-crystallizing the lattice, the growth of the crystal will occur under stress conditions created by the overlayer and result in a strained crystal. After the re-crystallization, the stress-inducing layer may be partly or completely removed, wherein, nevertheless, a certain amount of strain may be "conserved" in the re-grown lattice portion. This effect is generally known as stress memorization. Although the exact mechanism is not yet fully understood, it is believed that, upon re-crystallization of the substantially amorphized material, the increased volume of the amorphous material compared to the crystalline material may be substantially maintained due to the presence of the rigid surface layer that reduces or prevents the natural volume reduction which would usually occur during the re-crystallization, thereby causing the amorphous portion to "connect" to the surrounding template material in a strained state due to the rigidity of the overlying layer. Hence, the strained re-grown crystalline material may induce a corresponding tensile strain in the region adjacent to the re-crystallized region of increased volume, even if a portion or all of the rigid surface layer is removed.

Since many efficient strain-inducing mechanisms are available for PMOS transistors, such as embedded strained silicon/germanium material, stressed contact etch stop layers of very high intrinsic compressive stress and the like, respective strain engineering techniques may be desirable to preferably enhance performance of NMOS transistors.

For this reason, strain memorization techniques are an attractive approach for enhancing the overall strain characteristics of N-channel transistors, thereby compensating, to a certain degree, for the imbalance between N-channel transistors and P-channel transistors with respect to available strain-inducing mechanisms. For example, performance of P-channel transistors may be significantly enhanced by embedded strained silicon/germanium material, stressed contact etch stop layers of very high internal compressive stress and the like, wherein, typically, corresponding strain-inducing mechanisms may be less efficient for N-channel transistors. The conventional stress memorization approaches for N-channel transistors may typically be implemented in the overall CMOS process by taking advantage of the effect that the introduction of the N-type dopant for defining the deep drain and source regions and intermediate areas may be associated with a high degree of lattice damage, thereby resulting in a substantially amorphous state of a substantial portion of the drain and source regions due to the high dose and energy used. Thus, prior to performing a respective anneal process for re-crystallizing the implantation-induced damage and for activating the dopants, an appropriate stiff surface layer, such as a silicon nitride layer, is deposited and maintained during the anneal process, thereby obtaining the desired strain state of the re-grown deep drain and source regions, which may therefore induce the desired tensile strain in the channel region. However, in advanced semiconductor devices, complex dopant profiles may be required for the drain and source regions in the lateral and vertical direction, thereby requiring an implantation sequence in which the shielding effect of the gate electrode structure may be adapted in the lateral direction by providing two or more individual spacer elements and performing a respective implantation process. For example, after forming the gate electrode structure, possibly in combination with a moderately thin offset spacer for protecting the sidewalls and for adjusting a minimum desired offset during the subsequent implantation process, dopants may be introduced in order to define shallow drain and source regions, which may also have a reduced dopant concentration. Thereafter, typically, a first spacer element may be formed by depositing an etch stop liner material and a first spacer layer, which may be anisotropically etched on the basis of the etch stop liner in order to create a first spacer element to define a desired lateral distance to the gate electrode and thus the channel region located below the gate electrode. In a subsequent implantation process, possibly on the basis of an increased implantation energy and dose, an intermediate or buffer portion of the drain and source regions may be obtained. Thereafter, a further etch stop liner material followed by a further spacer layer may be deposited in order to form a second spacer element, which may act as an implantation mask, together with the previously-formed spacer elements and the gate electrode for creating the outer drain and source regions, which is accomplished by using appropriately selected high values for the implantation energy and dose, thereby also creating a significant crystalline damage. Thereafter, a further etch stop liner, in combination with the rigid surface layer, such as silicon nitride, may be deposited and may be used during a subsequent anneal process for obtaining the desired tensile strain in the channel region of the N-channel transistor. Although the above-described strategy may be efficiently implemented in the overall CMOS process flow, it turns out, however, that the performance gain of N-channel transistors is less pronounced than expected, in particular when highly complex sidewall spacer techniques are used during the creation of the complex lateral and vertical dopant profiles.

The present disclosure is directed to various methods that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

The present disclosure relates to techniques for forming advanced semiconductor devices in which performance of N-channel transistors may be enhanced on the basis of stress memorization techniques by improving the conditions during the re-growth of heavily damaged drain and source areas. Without intending to restrict the present application to the following explanation, it is believed that the presence of the sidewall spacer elements during the anneal process on the basis of the rigid surface layer may have a negative effect on the strained re-crystallization of the drain and source regions. That is, after forming one or two spacer elements and using the same as an implantation mask, in particular during the high energy and dose implantation process for forming the buffer regions and the deep drain and source regions, significant damage may also be created in the spacer elements, thereby possibly affecting their capability of avoiding or suppressing a reduction in volume upon the re-crystallization process. Consequently, a modified strain state of the drain and source areas positioned between the channel region and the deep drain and source regions may re-grow with a less pronounced strain, thereby also reducing the overall strain transfer mechanism obtained by the re-crystallized deep drain and source regions, which may have a high offset to the channel region corresponding to the width of the previously used spacer elements. According to illustrative aspects disclosed herein, one or more spacer elements may be removed prior to the deposition of the rigid surface material, so that the strained re-crystallized state of the drain and source regions may be positioned closer to the channel region, thereby enhancing the overall strain-inducing mechanism.

One illustrative method disclosed herein comprises forming drain and source regions of an N-channel transistor on the basis of a sidewall spacer structure formed on the sidewalls of a gate electrode, wherein the sidewall spacer structure comprises an etch stop layer and at least one spacer element. The method further comprises removing the at least one spacer element selectively to the etch stop layer and forming a material layer above the N-channel transistor. Finally, the method comprises performing an anneal process in the presence of the material layer to re-crystallize the drain and source regions of the N-channel transistor in a strained state.

A further illustrative method disclosed herein comprises forming an etch stop layer above a first transistor and a second transistor and forming at least one spacer element on the etch stop layer at sidewalls of a gate electrode of the first and second transistors. Moreover, drain and source regions of the first transistor are formed on the basis of the at least one spacer element, and the at least one spacer element is removed from the first and second transistors by using the etch stop layer as an etch stop. Additionally, the method comprises forming a material layer above the first and second transistors and annealing at least the first transistor in the presence of the material layer.

A still further illustrative method disclosed herein comprises forming an etch stop layer above a transistor comprising a gate electrode structure. Furthermore, a first spacer element is formed on the etch stop layer at the sidewalls of the gate electrode structure. The method further comprises performing a first ion implantation process using the first spacer element and the gate electrode structure as a first mask. Additionally, a second spacer element is formed on the first spacer element and a second ion implantation process is performed by using the first and second spacer elements and the gate electrode structure as a second mask. Moreover, the method comprises removing the first and second spacer elements in a common etch process by using the etch stop layer as an etch stop material. Additionally, a material layer is formed above the transistor and the transistor is annealed in the presence of the material layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides a process technique in which stress memorization techniques (SMT) may be efficiently applied during the manufacturing process for advanced transistor elements to achieve an enhanced strain transfer mechanism by reducing the offset of a material layer, in the presence of which the highly damaged state of drain and source regions is to be re-crystallized. It should be appreciated that, in the context of the present disclosure, a stress memorization technique is to be understood as a process in which a semiconductor region that may comprise a heavily damaged portion or a substantially amorphized portion may be annealed at temperatures that are sufficient to appropriately rebuild the respective crystalline structure in the presence of an overlying material layer having a sufficient rigidity or hardness to obtain a strained lattice structure. That is, a corresponding anneal process is performed in the presence of a cap layer that provides appropriate stress conditions in the semiconductor material in order to enable the creation of a strained state of the semiconductor material during the anneal process, wherein the strained state may be maintained in a more or less pronounced degree when a corresponding cap layer is partially or completely removed.

It is to be appreciated that the respective mechanisms for creating a strained semiconductor material on the basis of these memorization techniques may not be fully understood yet, while nevertheless providing significant advantages with respect to transistor performance on the basis of well-controllable process techniques. Without intending to restrict the present application to any theory, it is believed that enhanced conditions for the stress memorization approach may be obtained by positioning the rigid cap layer more closely to the gate electrode structure and thus the channel region so that the rebuilding of drain and source regions, which may have experienced a less degree of damage during the preceding implantation sequence, may rebuild in a more strained state, thereby also enhancing the overall strain transfer from the outer drain and source regions to the channel region. In this manner, the potential of stress memorization techniques may be exploited more intensively, thereby reducing an imbalance with respect to strain-inducing mechanisms between P-channel transistors and N-channel transistors. For example, in general, the degree of lattice damage in P-channel transistors may be less pronounced, depending on the used implantation species, so that a corresponding unwanted tensile strain created by the stress memorization technique may be less pronounced and may be efficiently over-compensated for by other high-efficient strain-inducing mechanisms available for P-channel transistors. In other illustrative embodiments disclosed herein, a more or less degree of selectivity may be applied to the stress memorization process, thereby significantly enhancing the performance of N-channel transistors, while not unduly negatively affecting the characteristics of the P-channel transistors.

In some illustrative embodiments disclosed herein, an efficient process flow for removing even highly complex spacer structures may be accomplished by providing the spacer elements of the same or similar material, which may be efficiently removed in a common etch process on the basis of an appropriately designed etch stop layer, thereby enabling the application of well-established plasma-based or wet chemical etch recipes without unduly contributing to the overall process complexity. Thereafter, the rigid material layer may be deposited with any appropriate thickness to comply with the requirements of the subsequent anneal process, wherein, in some illustrative approaches, the respective thickness of the material layer may also be selected in view of the further processing of the device, for instance, in view of defining a desired offset of spacer elements that may be formed from the material layer after the anneal process. For instance, the initial layer thickness may be selected such that a desired offset of metal silicide regions may be adjusted by using the respective spacer elements as a mask during the silicidation process.

In other approaches, an additional offset spacer material may be formed on the rigid material layer after the anneal process, for instance, after having formed the respective spacer elements or prior to forming the respective spacer elements, if the requirements for the layer thickness during the anneal process and the width of desired spacer elements for the subsequent processing may not be compatible. In still other illustrative embodiments, the material layer may be patterned prior to actually annealing the semiconductor device, thereby removing at least partially the material layer from above transistor elements in which a re-crystallization on the basis of a substantially strained state may be considered inappropriate.

In other cases, a certain degree of selectivity may be accomplished by performing an appropriate anneal sequence, wherein, in some illustrative embodiments, the material layer may be patterned into appropriate spacer elements for performing a deep drain and source implantation process after re-crystallizing the N-channel transistors on the basis of the previously formed material layer.

Figure 1A:
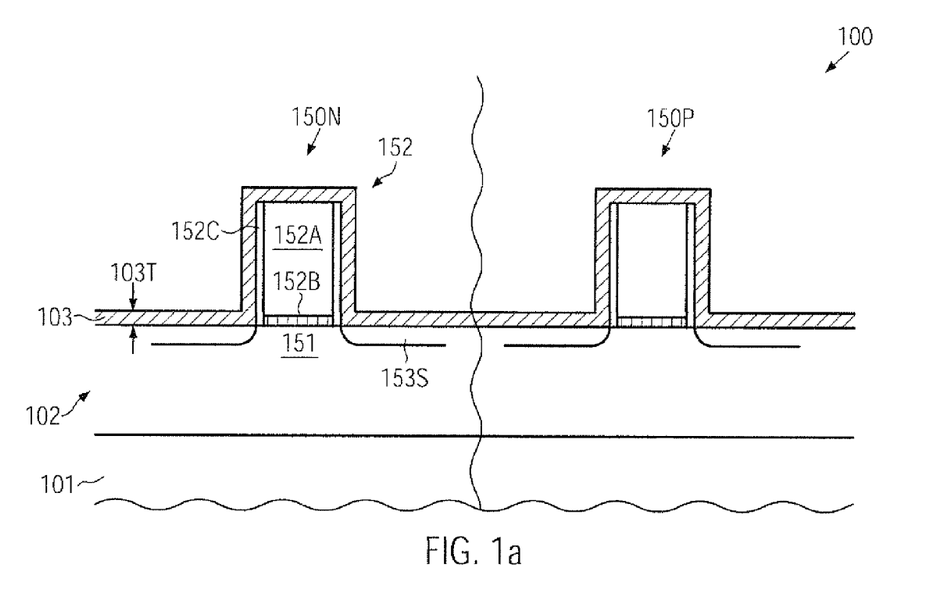
FIGS. 1a-1f schematically illustrate cross-sectional views of a semiconductor device comprising at least an N-channel transistor during various manufacturing stages in applying a stress memorization technique according to illustrative embodiments.

FIG. 1a schematically illustrates a semiconductor device 100 comprising a substrate 101, which may have formed thereon a semiconductor layer 102, such as a silicon-based semiconductor layer, which may be understood as a semiconductor material comprising a significant amount of silicon, while other atomic species may also be present, such as carbon, germanium, or other semiconductor alloys, dopants and the like. For example, the semiconductor layer 102 may include approximately 50 atomic percent silicon or more when averaged over the entire volume of the layer 102. It should be appreciated that, in some illustrative embodiments, the semiconductor layer 102 may represent an upper portion of the substrate 101, thereby providing a "bulk" configuration, while, in other embodiments, a buried insulating layer (not shown) may be provided between the semiconductor layer 102 and a base material of the substrate 101, thereby providing a semiconductor- or silicon-on-insulator (SOI) configuration. In other cases, the semiconductor device 100 may comprise SOI portions and bulk portions within a single die region, depending on the overall device requirements.

The semiconductor device 100 may further comprise a first transistor 150N which may represent an N-channel transistor and may also comprise a second transistor 150P, which may represent any type of transistor, such as a P-channel transistor, for which, in some cases, the stress memorization approach may be suppressed to a more or less degree, as will be described later on in more detail, or which may represent any other type of transistor which may or may not require the application of a stress memorization technique. The transistors 150N, 150P may comprise a channel region 151, located in the semiconductor layer 102 and positioned below a gate electrode structure 152, which may be comprised of any appropriate material, such as polysilicon and the like, wherein, in some approaches, the gate electrode structure 152 may also represent a placeholder structure which may be replaced by a highly conductive metal-containing material in a later manufacturing stage. The gate electrode structure 152 may comprise a gate electrode 152A formed above the channel region 151 and separated therefrom by a gate insulation layer 152B, which may be comprised of any appropriate material and may be provided with a thickness as required by design rules. Furthermore, if required, an offset spacer element 152C, for instance comprised of silicon dioxide and the like, may be formed on sidewalls of the gate electrode 152A with a thickness of one to several nanometers, depending on the overall requirements. It should be appreciated that, in typical applications, the channel regions 151 of the first and second transistors 150N, 150P may have the same configuration with respect to the crystallographic characteristics, i.e., the lattice structure and the orientation thereof, so that the application of the stress memorization technique may have a different effect when the transistors 150N, 150P may represent transistors of different conductivity type. For example, for a standard crystallographic orientation of the semiconductor layer 102, that is, for a (100) surface orientation, and with the transistor length direction, i.e., in FIG. 1a, the horizontal direction, orientated along a <110> crystal direction or a respective equivalent direction, a performance gain may be obtained for N-channel transistors in applying a stress memorization technique, due to the generation of a respective tensile strain in the channel region 151. On the other hand, a P-channel transistor may suffer from a certain degree of performance loss if a corresponding stress memorization technique may be applied, wherein, however, appropriate strain-inducing mechanisms may be available for P-channel transistors to over-compensate for a negative effect of the stress memorization approach, as previously explained.

In other illustrative embodiments, the transistor 150P, when representing a P-channel transistor, may have a different crystalline orientation in its channel region 151, for instance by providing respective semiconductor island of different crystallographic characteristics, wherein the application of tensile strain in the channel region 151 of the transistor 150P may also result in an overall performance gain. For example, a corresponding "hybrid" configuration may be accomplished by providing the substrate 101 with a crystalline template material of different crystallographic characteristics compared to the semiconductor layer 102, which may then be selectively removed to re-grow a semiconductor material on the basis of the underlying template material, thereby obtaining substantially the same crystallographic characteristic as in the template material of the substrate 101.

In the manufacturing stage shown, the semiconductor device 100 may comprise shallow drain and source regions 153S, which may have a specific depth and dopant concentration as required for the overall transistor characteristics. Frequently, the shallow drain and source regions 153S may also be referred to as drain and source extension regions or as lightly doped drain (LDD) regions, since a high, yet reduced dopant concentration compared to outer drain and source regions still to be formed is typically provided in the region 153S. Furthermore, an etch stop layer 103 is formed above the transistors 150N, 150P and may be comprised of any appropriate material that provides sufficient etch stop capabilities during a removal process for removing spacer elements in a later manufacturing stage. In one illustrative embodiment, the etch stop layer 103 may be provided in the form of a silicon dioxide material having a thickness 103T in combination with the overall material characteristics to meet the etch stop capabilities for the further processing. For instance, the thickness 103T may range from approximately 5-20 nm.

The semiconductor device 100 as shown in FIG. 1a may be formed on the basis of the following processes. The gate electrode structures 152 may be formed on the basis of well-established process techniques, involving oxidation and/or deposition of appropriate dielectric materials, followed by the deposition of the gate electrode material, for instance in the form of polycrystalline silicon, which may be accomplished by low pressure chemical vapor deposition (CVD) techniques. Next, an advanced patterning regime may be applied to obtain the gate electrode 152A and the gate insulation layer 152B, wherein it should be appreciated that the gate electrode 152A also includes other materials, such as a cap layer (not shown), if required for the further processing of the device 100. Thereafter, the offset spacer 152C may be formed, for instance, by oxidation and/or deposition with a subsequent anisotropic etch process, when the spacer material is to be removed from horizontal device portions. Next, an ion implantation process may be performed on the basis of appropriate implantation parameters in order to obtain the shallow drain and source regions 153S. Thereafter, the etch stop layer 103 may be formed, for instance, by low pressure CVD, plasma-enhanced CVD and the like, as long as the corresponding deposition technique enables a conformal and well-controlled deposition process to obtain the required material characteristics and thickness 103T. For this purpose, the etch stop capabilities for different materials and layer thicknesses may be examined for a given etch recipe for the removal of spacer elements in a later manufacturing stage in order to determine an appropriate target value, which may ensure a reliable protection of sensitive device areas during the corresponding etch sequence.

Figure 1B:
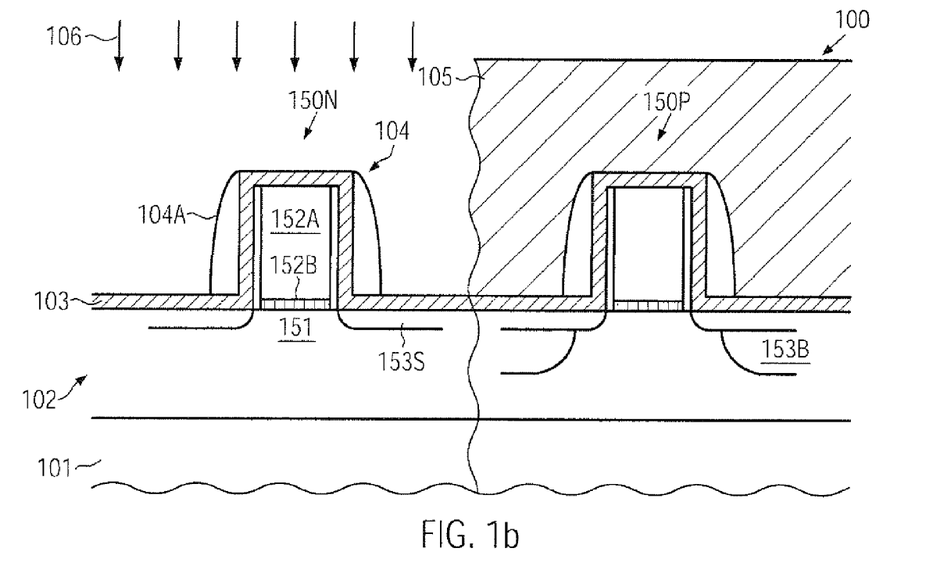

FIG. 1b schematically illustrates the semiconductor device 100 in a further advanced manufacturing state. As illustrated, a sidewall spacer structure 104 may be formed on the etch stop layer 103 at sidewalls of the gate electrode structure 152. The spacer structure 104 may comprise at least one spacer element in this manufacturing stage, depending on the overall complexity of the dopant profile to be created for the transistors 150N, 150P. For example, the spacer structure 104 may comprise a first spacer element 104A that may be comprised of any appropriate material, such as silicon nitride and the like. It should be appreciated that the at least one spacer element 104A may be comprised of a material having a high etch selectivity with respect to the etch stop layer 103, as previously explained. Furthermore, the semiconductor device 100 may comprise an implantation mask 105, for instance in the form of a resist mask, when the transistors 150N, 150P may represent transistors requiring a different dopant profile in the drain and source areas and/or a different type of a dopant. For example, as shown, the transistor 150P may have been exposed to a previous implantation process to form a buffer portion 153B or deep drain and source regions, when a less pronounced dopant profile may be required for the transistors 150N, 150P. Thus, during an implantation process 106, respective buffer regions may also be formed in the transistor 150N. It should be appreciated, however, that a different sequencing may be used, for instance, by first performing the implantation process 106 and thereafter forming the regions 153B in the transistor 150P. Consequently, during the manufacturing sequence for forming the spacer structure 104, the characteristics thereof, i.e., a spacer width of the at least one element 104A, may be designed in conformity with the desired overall lateral dopant profile. That is, if the implantation process 106 is designed to provide deep drain and source regions without any intermediate or buffer areas, the width of the spacer element 104A may be adapted to the desired value, which may be accomplished by depositing an appropriate spacer layer of a sufficient initial thickness and performing an anisotropic etch process, in which also the etch stop layer 103 may provide the required etch stop capabilities.

Figure 1C:
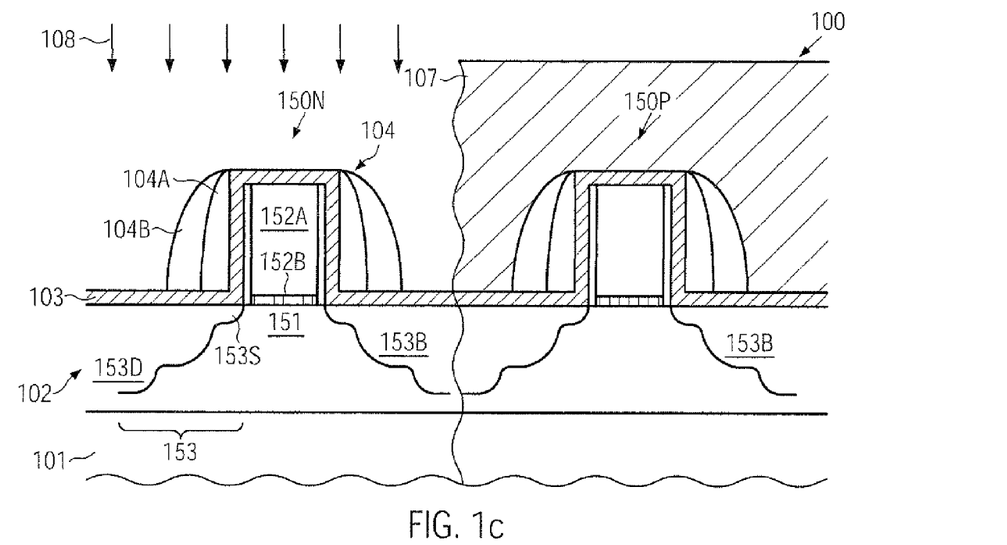

FIG. 1c schematically illustrates the semiconductor device 100 according to further illustrative embodiments, in which a more pronounced lateral dopant profile may be required. As illustrated, the spacer structure 104 may be completed by a second spacer element 104B, which substantially defines the point of entry for a dopant species during a further implantation process 108 that may be performed on the basis of a further implantation mask 107 that covers the transistor 150P. Consequently, during the implantation process 108, deep drain and source regions 153D may be formed to provide, in combination with the shallow regions 153S and previously formed buffer regions 153B, completed drain and source regions, which are commonly referred to as drain and source regions 153. In the embodiment shown, it may be assumed that the respective deep drain and source regions 153D may have been formed in the transistor 150P in a preceding implantation process, while, in other cases, the implantation process 108 based on the mask 107 may be carried out first and thereafter a further implantation process may be performed while covering the transistor 150N, depending on the overall process strategy.

In one illustrative embodiment, the spacer structure 104 comprises the first and second spacer elements 104A, 104B such that both spacer elements may be removed in a common etch process, thereby enhancing the overall process efficiency. For example, the first and second spacer elements 104A, 104B may be comprised of substantially the same material, such as silicon nitride, silicon oxide, silicon oxynitride, silicon carbide, polysilicon and the like, as long as a sufficient etch selectivity with respect to the etch stop layer 103 may be provided. Thus, a high degree of compatibility with conventional manufacturing approaches may be obtained, when usually employed spacer materials, such as silicon nitride, may be used. On the other hand, since the spacer structure 104 may be removed during the further processing, an enhanced degree of flexibility in selecting an appropriate material may be provided, since, for instance, the dielectric capabilities of the spacer structure 104 may be less relevant for the finally obtained device characteristics. In the illustrative embodiment shown, the second spacer element 104B may be formed by depositing an appropriate spacer material, such as one of the materials specified above, without providing any intermediate etch stop liner, as is typically the case in conventional spacer strategy. For this purpose, the characteristics and the thickness of the etch stop layer 103 may be selected such that a patterning of the spacer layer for forming the second spacers 104B, as well as the patterning process for forming the first spacer element 104A, may be accomplished on the basis of the material 103, while nevertheless maintaining a sufficient thickness to act as an etch stop material during the subsequent removal of the spacer structure 104, as previously explained.

Figure 1D:
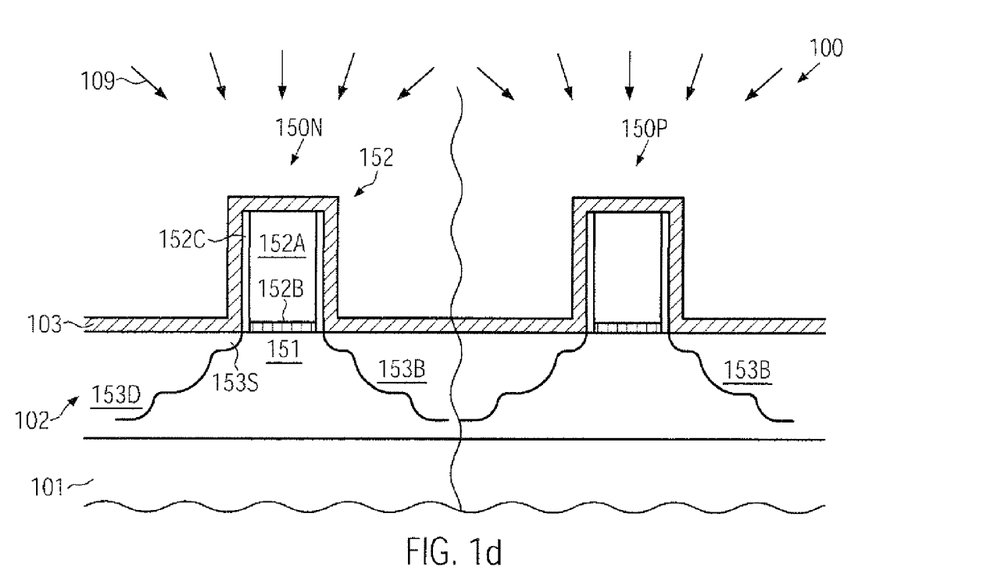

FIG. 1d schematically illustrates the semiconductor device 100 during an etch process 109 for removing the spacer structure 104, which may comprise at least one spacer element, such as the spacer elements 104A, 104B. It should further be appreciated that, if a more pronounced lateral profiling of the drain and source regions 153 may be required, the spacer structure 104 may comprise more than two spacer elements. In one illustrative embodiment, the etch process 109 is designed to remove any of the spacer elements in the structure 104 in a common process sequence, as previously explained. For instance, selective wet chemical etch recipes are available for a plurality of materials, such as silicon nitride, which may, for instance, be etched selectively to silicon dioxide on the basis of hot phosphoric acid. In other cases, polysilicon material may be etched with high selectivity to silicon dioxide on the basis of well-established process recipes. Similarly, silicon dioxide may be etched with high selectivity with respect to silicon, silicon nitride and the like. For example, the spacer structure 104 may be comprised of silicon dioxide, while the etch stop layer 103 may be provided in the form of a silicon nitride material.

Figure 1E:
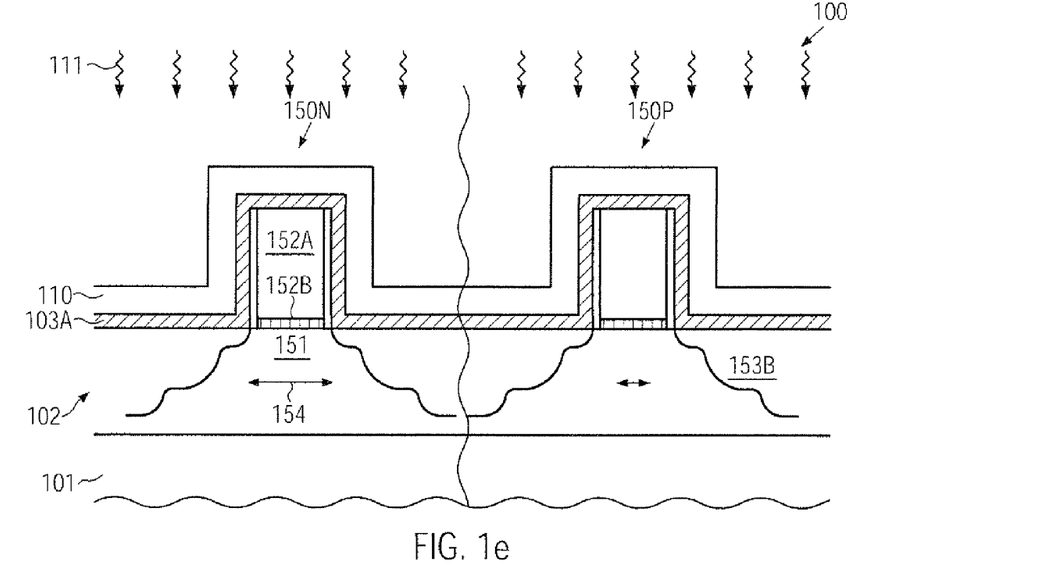

FIG. 1e schematically illustrates the semiconductor device 100 in a further advanced manufacturing stage, in which a material layer 110 may be formed above the transistors 150N, 150P, wherein, in the illustrative embodiment shown, the etch stop layer 103 may still be present below the material layer 110 or the etch stop layer 103 may have been removed, for instance, due to the certain degree of etch damage, and a further etch stop material 103A, for instance in the form of silicon dioxide, may have been deposited so as to enable an efficient removal of the material layer 110, or at least portions thereof, without significantly changing the overall characteristics of the transistors 150N, 150P. The material layer 110 may be represented as a "rigid" material, i.e., it may be a material of sufficient hardness or rigidity to withstand a significant change in volume, except for the usual thermal variation in volume, which may be created during an anneal process 111 for re-crystallizing implantation-induced damage, as previously explained. For example, the material layer 110, which may be comprised of silicon nitride, may be formed on the layer 103 or newly formed etch stop material 103A and may strongly adhere to the layer 103A, which in turn strongly adheres to the surface of the drain and source regions 153. As previously indicated, in particular due to the high ion bombardment in the N-channel transistor 150N, the deep drain and source areas 153D and in a somewhat lesser degree, in the areas 153B and 153S (see FIG. 1d), a significant damage may have occurred, which may even result in a substantially amorphized state, which typically results in an increased volume compared to the crystalline state. Consequently, a reduction of the volume during the anneal process, which may, in some illustrative embodiments, be performed at any appropriate temperature, for instance from approximately 550-800° C., when a pronounced diffusion of the dopants in the drain and source regions 153 may not be desired, may be suppressed or at least reduced.

In other cases, significantly higher temperatures may be applied or any combination of anneal cycles may be used, such as one anneal step including relatively low temperatures, in combination with a high temperature step, for instance, with reduced duration and the like. It should be appreciated that a plurality of anneal process techniques are available which may be used during the process 111. For example, advanced laser-based or flash-light-based anneal processes may be used, in which the effective exposure to radiation of the device 100 is restricted to very short time periods in the range of 0.1 seconds to a few microseconds or even less, thereby significantly reducing diffusion of dopant species, while nevertheless providing activation and re-crystallization in the drain and source regions 153. Consequently, upon re-crystallizing the drain and source regions 153 while substantially suppressing a reduction in volume, a strained crystal state may be achieved, which in turn results in a respective tensile strain 154 in the channel region 151 in the transistor 150N, due to the heavily damaged or substantially amorphized state of the drain and source regions 153 therein, while a corresponding tensile strain 154 in the transistor 150P, when representing a P-channel transistor, may be significantly less, due to the reduced degree of crystal damage owing to dopant species, such as boron and the like. Furthermore, as previously indicated, even moderately pronounced tensile strain components in the transistor 150P may be over-compensated for by appropriate additional strain-inducing mechanisms, such as embedded strained semiconductor material (not shown), stressed dielectric material that may be positioned above the transistor 150P and 150N in a later manufacturing stage and the like. In other cases, the effect of the anneal process 111 may be reduced or substantially avoided in the transistor 150P, as will be described later on.

Figure 1F:
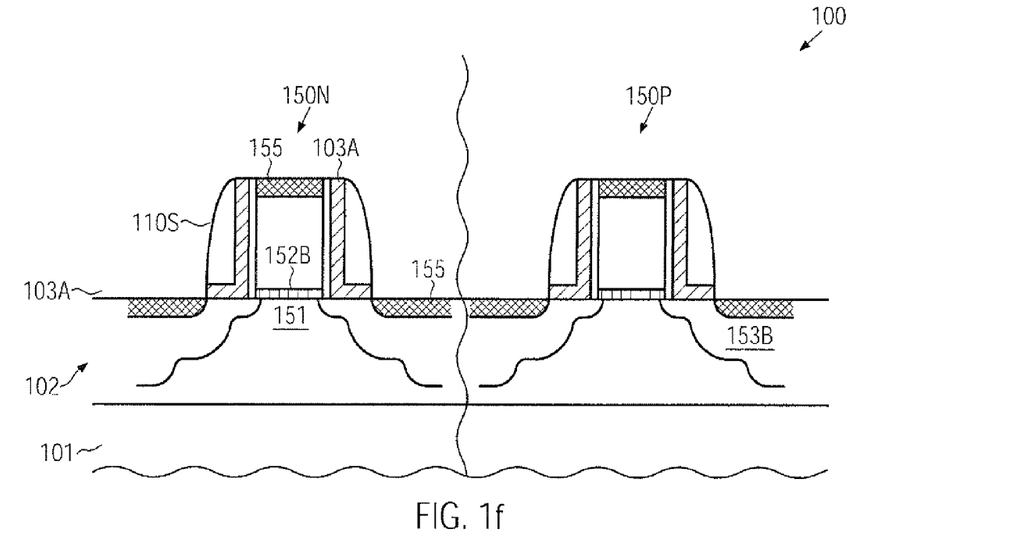

FIG. 1f schematically illustrates the device 100 in a further advanced manufacturing stage. As shown, spacer elements 110S may be formed at sidewalls of the gate electrode structure 152 in combination with the etch stop liner 103A. Furthermore, metal silicide regions 155, if required, may be formed in the drain and source regions 153 and in the gate electrode 152A, depending on the overall process strategy. The spacers 110S may be formed on the basis of the material layer 110 after the anneal process 111, by performing an anisotropic etch process, using the liner 103A as an etch stop material. For this purpose, well-established process techniques may be used, such as spacer techniques as are well established for silicon nitride and silicon dioxide. Thereafter, the further processing may be continued by depositing an interlayer dielectric material, which may comprise layers of high internal stress levels, to further enhance the performance of one or both of the transistors 150N, 150P, as previously explained. After forming an appropriate interlayer dielectric material, respective contact elements may be formed by patterning the interlayer dielectric material and re-filling the openings with an appropriate conductive material, such as tungsten, copper and the like.

Thus, a highly efficient strain-inducing mechanism may be accomplished by removing the initially formed spacer structure 104 (FIG. 1c) prior to the deposition of the material layer 110 (FIG. 1e), thereby positioning it close to the channel region 151, which may result in an enhanced strain transfer mechanism, as previously explained. Additionally, the material layer 110 may be used for the further processing of the device 100, for instance, for providing an appropriate mask during the silicidation sequence, thereby establishing a desired offset between the metal silicide regions 155 and the channel region 151. In some cases, the thickness of the material layer 110 may be selected with respect to obtaining enhanced results during the anneal process 111, for instance when performed as a laser-based or flash-light-based anneal process, wherein a reduced thickness of the layer 110 may be advantageous in obtaining the desired heat transfer. Thus, in some cases, a desired thickness of the layer 110 during the anneal process 111 may not correspond to a desired width of the spacer elements 110S. In this case, according to some illustrative embodiments, the width of the spacer elements 110S may be adapted by depositing a further offset layer to obtain the desired overall width.

Figure 1G:
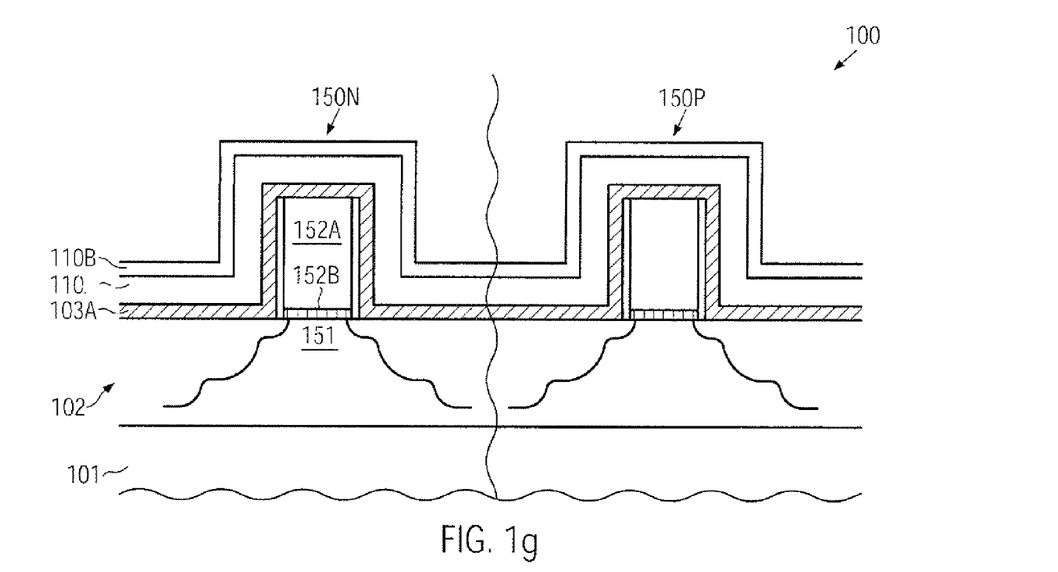
FIG. 1g schematically illustrates a cross-sectional view of the semiconductor device according to further illustrative embodiments, in which a width of spacer elements after patterning the material layer for generating tensile strain in the N-channel transistor may be increased by the deposition of a further spacer material.

FIG. 1g schematically illustrates the semiconductor device 100 after the anneal process 111 and the deposition of a respective offset layer 110B having a thickness that is appropriate in combination with the thickness of the layer 110 to provide a desired width of the spacer 110S (FIG. 1f). Hence, after the deposition of the layer 110B, which may be comprised of the same material as the layer 110, both layers may be patterned in a common anisotropic etch process according to well-established approaches. Thus, the spacer 110S may be obtained with a desired increased width, thereby complying with the requirements of the subsequent processing, such as the formation of the metal silicide regions 155 (FIG. 1f) in order to establish a desired offset to the channel region 151.

As previously indicated, in some cases, it may be desirable to reduce or suppress the stress memorization effect for the transistor 150P in order to selectively enhance performance of the transistor 150N, while providing other highly efficient strain-inducing mechanisms for the transistor 150P.

Figure 1H:
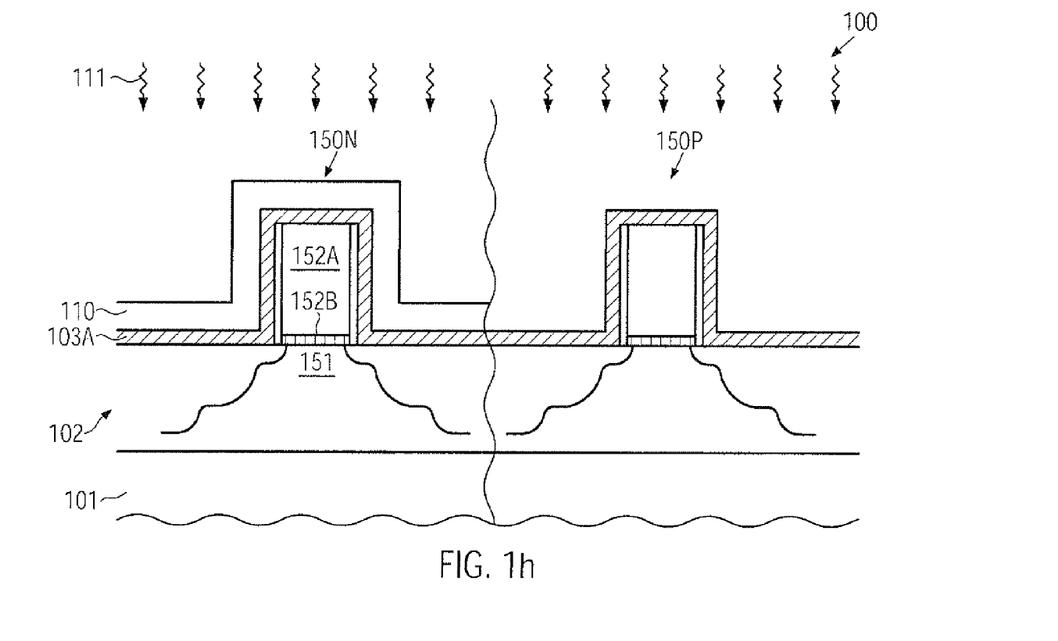
FIGS. 1h-1i schematically illustrate cross-sectional views of the semiconductor device during various manufacturing stages, in which the stress memorization technique may be selectively applied to N-channel transistors according to further illustrative embodiments.

FIG. 1h schematically illustrates the semiconductor device 100 according to further illustrative embodiments, in which the material layer 110 is removed from the transistor 150P, which may be accomplished on the basis of an additional lithography step and a corresponding etch process, in which the layer 103 or the layer 103A may act as an efficient etch stop material. After the removal of the etch mask, the anneal process 111 may be performed as previously indicated, wherein, however, the re-crystallization of the transistor 150P may be accomplished without the interaction of the layer 110, thereby resulting in a substantially non-strained state, when other strain-inducing mechanisms may not be present in the transistor 150P, or a strained state of a desired type, for instance, created on the basis of an embedded silicon/germanium alloy and the like (not shown), may be re-established.

Figure 1I:
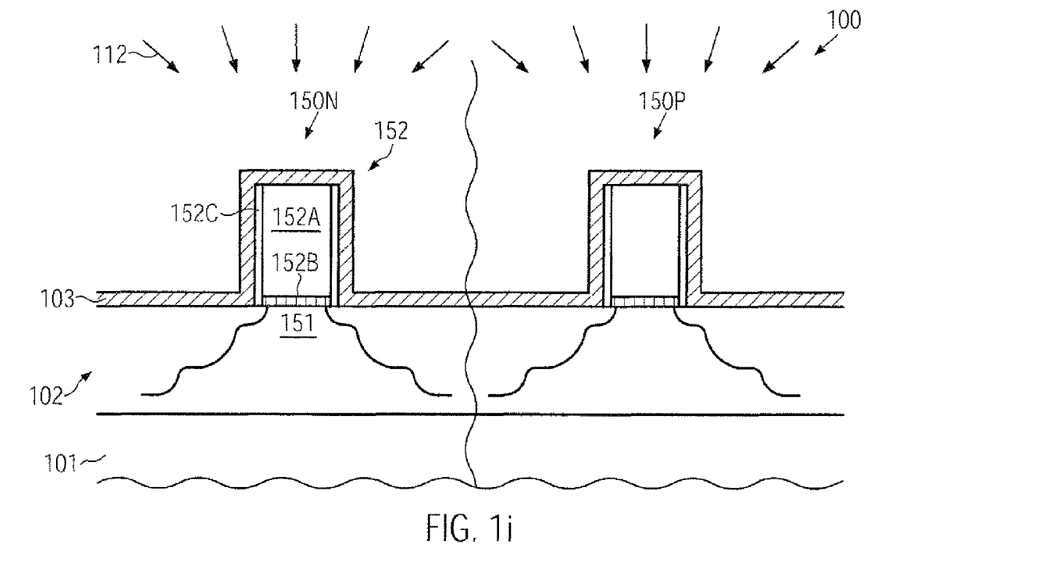

FIG. 1i schematically illustrates the semiconductor device 100 after the anneal process 111 and during a further etch process 112 to remove the layer 110 from the transistor 150N. In one illustrative embodiment, as shown, the etch process 112 may be performed as a non-masked etch process in which the layer 103 or 103A may protect the transistor 150P, while also acting as an etch stop material in the transistor 150N. Consequently, any further lithography processes may be avoided. Thereafter, a further spacer layer may be deposited and may be patterned to obtain further sidewall spacer elements, which may then be used during the subsequent silicidation process, as previously explained.

Figure 1J:
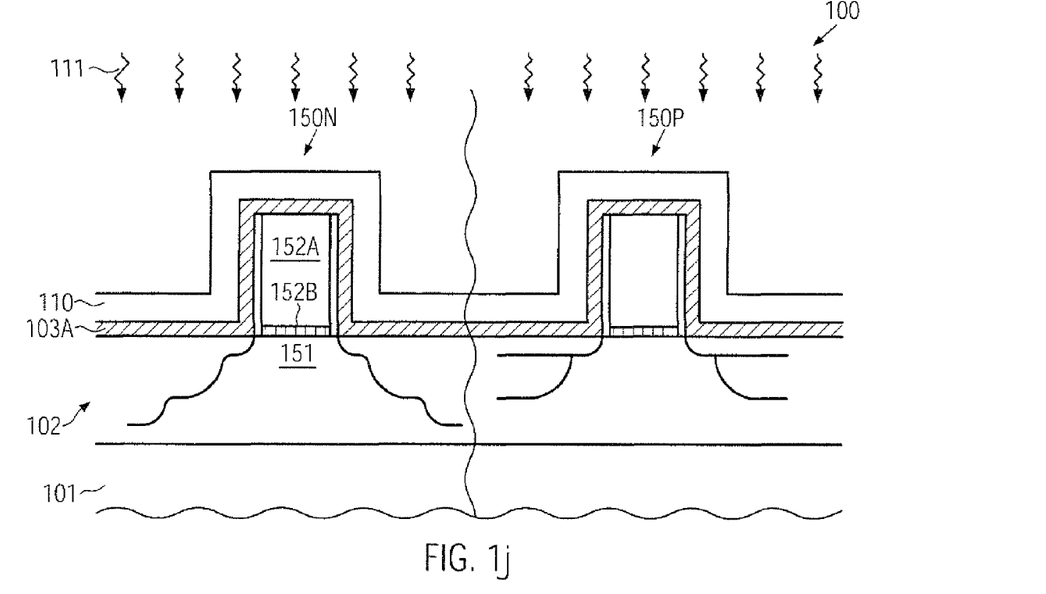
FIGS. 1j-1k schematically illustrate cross-sectional views of a semiconductor device in which the stress memorization technique may be applied with significantly less effect to specified transistors, such as P-channel transistors, according to still further illustrative embodiments.

FIG. 1j schematically illustrates the semiconductor device 100 according to still further illustrative embodiments. As shown, the material layer 110 is formed above the transistors 150N, 150P, wherein the transistor 150P may have formed therein the shallow drain and source regions 153S, possibly in combination with the buffer areas 153B, if respective buffer regions may be required. In other cases, a less pronounced lateral profile is appropriate, that is, if the shallow drain and source regions 153S and the deep drain and source regions 153D are appropriate, the transistor 150P may have formed therein the shallow drain and source regions 153S at this manufacturing stage. On the other hand, the drain and source regions 153 of the N-channel transistor 150N may be in a heavily damaged or substantially amorphized state, as previously discussed. Furthermore, the material layer 110 may be provided with an appropriate thickness so as to act as an implantation mask for the formation of the deep drain and source regions in the transistor 150P in a later manufacturing stage. In other cases, the thickness of the material layer 110 may be selected so as to be appropriate for the anneal process 111 and subsequently the thickness may be increased by depositing a further material, as previously explained with reference to FIG. 1g.

The semiconductor device 100 as shown in FIG. 1j may be formed on the basis of similar process techniques, as previously described, wherein, however, during the corresponding implantation sequence for forming the drain and source regions in the transistors 150N, 150P, the spacer structure 104 may be used for defining the dopant profile in the transistor 150N and may be removed prior to forming the respective deep drain and source regions in the transistor 150P on the basis of process techniques, as previously described. Consequently, during the anneal process 111, the drain and source regions 153 in the transistor 150N may re-crystallize in a highly strained state, thereby creating the strain 154 (FIG. 1e), while, in the transistor 150p, a significantly lower degree of crystal damage may be present, thereby resulting in a significantly reduced tensile strain. During the anneal process 111, the respective process parameters may be selected such that a desired degree of dopant diffusion may be obtained, if an effective channel length is to be adjusted in the transistors 150N, 150P, while, in other cases, advanced anneal techniques may be used, as previously described, thereby maintaining the overall dopant diffusion at a low level so that the desired degree of dopant diffusion, if required, may be adjusted in a later anneal process after forming the deep drain and source regions in the transistor 150P.

Figure 1K:
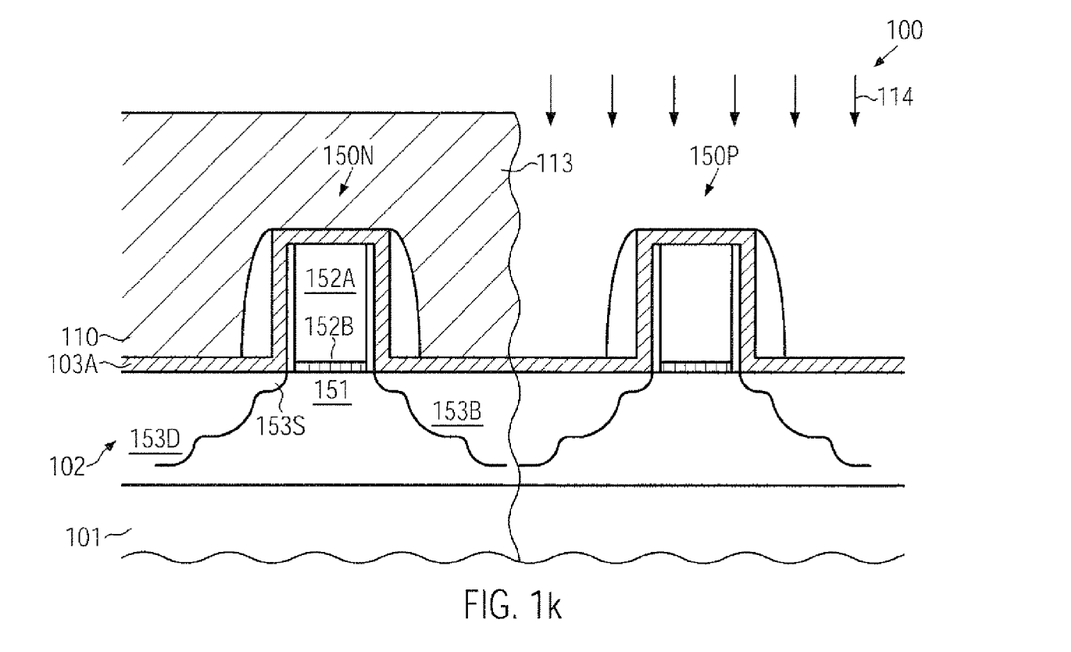

FIG. 1k schematically illustrates the semiconductor device 100 in a further advanced manufacturing stage. As shown, the transistors 150N, 150P may comprise spacer elements 110S, which may be formed directly from the layer 110 or on the basis of an additional offset layer, such as the layer 110B (FIG. 1g) on the basis of well-established process techniques. Furthermore, an implantation mask 113 may be provided to cover the transistor 150N during an implantation process 114 designed to create the deep drain and source regions 153D in the transistor 150P. Thereafter, a further anneal process may be performed in which the deep drain and source regions 153D may be re-crystallized and the dopant species therein may be activated, while also an enhanced degree of dopant activation may be achieved in the transistor 150N. During a corresponding anneal process, appropriate process parameters may be used, for instance, with respect to effective surface temperature, duration and the like in order to obtain the overall desired process result. It should be appreciated that using two anneal cycles may provide enhanced flexibility in individually adjusting the dopant profiles without unduly affecting the characteristics of transistors of different conductivity type. Thus, also in this case, a significantly reduced effect of the stress memorization technique on the transistor 150P may be accomplished, without requiring additional lithography steps compared to the conventional approach, since the mask 113 may be required anyway, irrespective of whether the stress memorization approach is applied or not.

As a result, the present disclosure provides techniques for enhancing the stress memorization approach by positioning the rigid material layer more closely to the channel region upon performing the anneal process, thereby enhancing the strain transfer mechanism. This may be accomplished by removing a spacer structure that may be used for defining the lateral dopant profile of the N-channel transistor, wherein the material layer may thereafter be used as a spacer layer for the further processing of the devices. Thus, enhanced efficiency may be achieved during stress memorization techniques, while not unduly affecting the overall process flow. In some illustrative embodiments, a certain degree of selectivity of the stress memorization technique may be achieved while not unduly contributing to the overall process complexity. In one illustrative embodiment, selectivity of the stress memorization technique may be achieved without requiring an additional lithography process compared to conventional strategies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first sidewall spacer structure on sidewalls of a gate electrode of an N-channel transistor and a second sidewall spacer structure on sidewalls of a gate electrode of a P-channel transistor in a common patterning sequence, said first and second sidewall spacer structures comprising an etch stop layer and at least one spacer element;
    forming drain and source regions of said N-channel transistor by using said first sidewall spacer structure as an implantation mask;
    forming drain and source regions of said P-channel transistor by using said second sidewall spacer structure as an implantation mask;
    removing said at least one spacer element of each of said first and second sidewall spacer structures selectively to said etch stop layer in a common etch process;
    forming a material layer above said N-channel transistor and above said P-channel transistor; and
    selectively removing a first portion of said material layer from above said P-channel transistor, and thereafter performing an anneal process in the presence of a second portion of said material layer to re-crystallize said drain and source regions of the N-channel transistor in a strained state.

2. The method of claim 1, further comprising etching said second portion of said material layer to form a further spacer element at sidewalls of said gate electrode of said N-channel transistor.

3. The method of claim 2, further comprising forming a metal silicide in said drain and source regions of said N-channel transistor using said further spacer element as a mask.

4. The method of claim 2, further comprising depositing an offset material layer above at least said second portion of said material layer prior to etching said second portion of said material layer to form said further spacer element from said second portion of said material layer and said offset material layer.

5. The method of claim 1, further comprising forming shallow drain and source portions of at least said N-channel transistor, and thereafter forming said etch stop layer and a first spacer layer above said N-channel and said P-channel transistors, etching said first spacer layer to form a first spacer element on said gate electrode of each of said N-channel and said P-channel transistors, and performing an implantation process using said first spacer element as a mask.

6. The method of claim 5, further comprising forming a second spacer element on said first spacer element and using said first and second spacer elements as an implantation mask.

7. The method of claim 6, wherein removing said at least one spacer element comprises removing said first and second spacer elements in a common etch process.

8. The method of claim 1, further comprising removing said second portion of said material layer above said N-channel transistor and forming offset spacer elements on said sidewalls of said gate electrodes of said P-channel transistor and said N-channel transistor.

9. A method, comprising:
    forming an etch stop layer above a first transistor and a second transistor;
    forming at least one spacer element on said etch stop layer at sidewalls of a gate electrode of said first and second transistors;
    forming drain and source regions of said first transistor on the basis of said at least one spacer element;
    removing said at least one spacer element from said first and second transistors by using said etch stop layer as an etch stop;
    forming a material layer above said first and second transistors;
    annealing said first and second transistors in the presence of said material layer;
    after annealing said first and second transistors, forming a second spacer element from said material layer; and
    forming deep drain and source regions of said second transistor on the basis of said second spacer element.

10. The method of claim 9, further comprising forming drain and source regions of said second transistor on the basis of said at least one spacer element.

11. The method of claim 9, further comprising forming an offset spacer layer on said material layer prior to forming said second spacer element.

12. The method of claim 9, further comprising removing said material layer from above said second transistor prior to annealing said first and second transistors.

13. The method of claim 12, wherein forming said at least one spacer element comprises forming a first spacer element on said etch stop layer and forming a second spacer element on said first spacer element.

14. A method, comprising:
    forming a first sidewall spacer structure on sidewalls of a gate electrode of an N-channel transistor and a second sidewall spacer structure on sidewalls of a gate electrode of a P-channel transistor in a common patterning sequence, said first and second sidewall spacer structures comprising an etch stop layer and at least one spacer element;
    forming drain and source regions of said N-channel transistor on the basis of said first sidewall spacer structure;

removing said at least one spacer element of each of said first and second sidewall spacer structures selectively to said etch stop layer in a common removal process;

forming a material layer above said N-channel transistor and above said P-channel transistor;

performing an anneal process in the presence of said material layer to re-crystallize said drain and source regions of at least said N-channel transistor in a strained state;

after performing said anneal process, forming a further spacer element on sidewalls of said gate electrodes of said P-channel transistor and said N-channel transistor from said material layer; and forming deep drain and source regions of said P-channel transistor on the basis of said further spacer element.

* * * * *